US012677448B2

(12) United States Patent (10) Patent No.: US 12,677,448 B2
Xiang et al. (45) Date of Patent: Jul. 7, 2026

(54) SEMICONDUCTOR STRUCTURE AND PREPARATION METHOD THEREOF

(71) Applicant: ENKRIS SEMICONDUCTOR, INC., Suzhou (CN)

(72) Inventors: Peng Xiang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 428 days.

(21) Appl. No.: 18/363,882

(22) Filed: Aug. 2, 2023

(65) Prior Publication Data

US 2024/0063257 A1 Feb. 22, 2024

(30) Foreign Application Priority Data

Aug. 22, 2022 (CN) .......................... 202211008418.8

(51) Int. Cl.
*H10D 30/47* (2025.01)
*H10D 62/10* (2025.01)
*H10P 32/10* (2026.01)
*H10P 32/14* (2026.01)

(52) U.S. Cl.
CPC ........... *H10D 62/103* (2025.01); *H10P 32/14* (2026.01); *H10P 32/174* (2026.01); *H10D 30/475* (2025.01)

(58) Field of Classification Search
CPC ......... H01L 21/0262; H01L 21/02538–02549;

H01L 21/0257–02584; C23C 14/0617; C23C 16/301–303; C01B 21/072–0728; C01B 21/0632; H10D 30/47–485; H10D 30/015; H10P 14/24; H10P 14/3414–3422; H10P 14/3438–3448
See application file for complete search history.

(56) References Cited

U.S. PATENT DOCUMENTS

2019/0214492 A1* 7/2019 Sato ..................... H10D 30/015
2023/0343829 A1* 10/2023 Fareed .............. H01L 21/02532
2023/0343830 A1* 10/2023 Kim ........................ H10D 62/60
2023/0387282 A1* 11/2023 Mohanta .............. H10D 30/475

* cited by examiner

*Primary Examiner* — Matthew C Landau
*Assistant Examiner* — Nora T. Nix
(74) *Attorney, Agent, or Firm* — Westbridge IP LLC

(57) ABSTRACT

Disclosed are a semiconductor structure and a preparation method thereof. The semiconductor structure includes a substrate, including a first region arranged at the center of the substrate and a second region arranged at the periphery of the first region; and a composite buffer layer arranged on the substrate, including a carbon-containing first buffer layer including at least one set of a first sub-buffer layer and a second sub-buffer layer stacked in layers; therein, a carbon concentration of the first sub-buffer layer arranged at the first region is higher than that arranged at the second region; and a carbon concentration of the second sub-buffer layer arranged at the first region is lower than that at arranged the second region. Therefore, uniformity of the carbon concentration of the composite buffer layer is improved to improve resistivity of the composite buffer layer, so as to increase breakdown voltage and improve device performance.

20 Claims, 3 Drawing Sheets

SEMICONDUCTOR STRUCTURE AND PREPARATION METHOD THEREOF

CROSS-REFERENCE TO RELATED APPLICATIONS

The application claims priority to Chinese Patent Application CN202211008418.8, filed on Aug. 22, 2022, the entire contents of which are incorporated herein by reference.

TECHNICAL FIELD

The disclosure relates to the technical field of semiconductors, in particular, to a semiconductor structure and a preparation method thereof.

BACKGROUND

GaN-based high electron mobility transistors (GaN HEMTs) not only have excellent properties of GaN materials such as large band gap, high electron saturation drift speed, high temperature resistance, radiation resistance and good chemical stability, but also may be used under high voltage, high power and high temperature as GaN materials may be used to form a two-dimensional electron gas channel of a high concentration and a high migration rate with aluminum gallium nitride (AlGaN) and other materials. Therefore, the GaN HEMT is one of the most potential transistors for applications in power electronics.

However, for ordinary GaN HEMTs, when the device is subjected to a high voltage, electrons injected from a source electrode can pass through a buffer layer to a drain electrode to form a leakage channel. Excessive leakage of the buffer layer will lead to premature breakdown of the device. In traditional methods, it is usual to dope the buffer layer with carbon (C) element to improve the resistance of the buffer layer, but when the carbon element is doped through a traditional doping method, a carbon concentration at the center of the wafer and a carbon concentration at the edge of the wafer are not even, resulting in that the carbon concentration at the center or at the edge of the wafer is too high or too low. And a carbon concentration which is too high or too low will reduce resistivity of the region, thereby greatly reducing a breakdown voltage and affecting the device performance.

SUMMARY

The purpose of the present disclosure is to provide a semiconductor structure and a preparation method thereof, so as to solve a problem of uneven carbon concentration at a center and an edge of a wafer.

According to an aspect of the present disclosure, a semiconductor structure is provided, including: a substrate, including a first region at a center of the substrate and a second region at a periphery of the first region; and a composite buffer layer arranged at the substrate, the composite buffer layer including a first buffer layer, the first buffer layer including a carbon element, and the first buffer layer including at least one set of a first sub-buffer layer and a second sub-buffer layer stacked in layers.

A carbon concentration of the first sub-buffer layer arranged at the first region is higher than a carbon concentration of the first sub-buffer layer arranged at the second region; a carbon concentration of the second sub-buffer layer arranged at the first region is lower than a carbon concentration of the second sub-buffer layer arranged at the second region.

As an optional embodiment, the carbon concentration of the first sub-buffer layer arranged at the first region is higher than the carbon concentration of the second sub-buffer layer arranged at the first region.

As an optional embodiment, the carbon concentration of the first sub-buffer layer arranged at the second region is lower than the carbon concentration of the second sub-buffer layer arranged at the second region.

As an optional embodiment, a minimum repeating unit of the first buffer layer is the first sub-buffer layer and the second sub-buffer layer, and in the minimum repeating unit, the first sub-buffer layer is close to a side of the substrate side; or the second sub-buffer layer is close to a side of the substrate.

As an optional embodiment, a thickness of the first sub-buffer layer and a thickness of the second sub-buffer layer are both lower than 5 um.

As an optional embodiment, the composite buffer layer includes at least one of the first buffer layer, the composite buffer layer further includes at least one second buffer layer, and the at least one second buffer layer and the at least one of the first buffer layer are alternately stacked on a side of the substrate, and the second buffer layer includes a carbon element, and an average carbon concentration of the second buffer layer is lower than or higher than an average carbon concentration of the first buffer layer.

As an optional embodiment, the second buffer layer includes at least one set of a third sub-buffer layer and a fourth sub-buffer layer stacked in layers, a carbon concentration of the third sub-buffer layer arranged at the first region is higher than a carbon concentration of the third sub-buffer layer arranged at the second region, and a carbon concentration of the fourth sub-buffer layer arranged at the first region is lower than a carbon concentration of the fourth sub-buffer layer arranged at the second region.

As an optional embodiment, a carbon concentration of the composite buffer layer is higher than 1E17 and lower than 2E20.

As an optional embodiment, a carbon concentration of the composite buffer layer gradually increases or firstly increases and then decreases along a direction from the substrate to the composite buffer layer.

As an optional embodiment, the composite buffer layer further includes an aluminum element, and a composition content of aluminum is constant or gradually decreases or firstly increases and then decreases, or is complementary to a composition content of carbon along a direction from the substrate to the composite buffer layer.

As an optional embodiment, a shape of the first region is any one of a circle, an ellipse or a polygon.

As an optional embodiment, an area of the first region is lower than half of an area of the substrate.

As an optional embodiment, the semiconductor structure further includes a transition layer arranged between the substrate and the composite buffer layer.

As an optional embodiment, the semiconductor structure further includes a barrier layer arranged at a side of the composite buffer layer away from the substrate, wherein a carbon concentration of the barrier layer is lower than a carbon concentration of the composite buffer layer.

According to another aspect, the present disclosure further provides a preparation method for a semiconductor structure, including:

providing a substrate, wherein the substrate includes a first region arranged at a center of the substrate and a second region arranged at a periphery of the first region; and preparing a composite buffer layer on the substrate, comprising:

preparing a first buffer layer, comprising: preparing at least one set of a first sub-buffer layer and a second sub-buffer layer stacked in layers; and doping a carbon element in the first buffer layer, wherein a carbon concentration of the first sub-buffer layer arranged at the first region is higher than a carbon concentration of the first sub-buffer layer arranged at the second region, and a carbon concentration of the second sub-buffer layer at the first region is lower than a carbon concentration of the second sub-buffer layer arranged at the second region.

As an optional embodiment, the preparing a first sub-buffer layer includes: preparing the first sub-buffer layer in a first condition, wherein the first condition includes that a carbon element doping source is an organic compound.

As an optional embodiment, the preparing a second sub-buffer layer includes: preparing the second sub-buffer layer in a second condition, wherein the first condition includes that a carbon element doping source is a high-purity metal-organic compound source (MO source), and the second condition further includes: a temperature is lower than 1000° C., or a growth rate is higher than 2 um/h.

As an optional embodiment, the preparing a composite buffer layer on the substrate further includes: preparing at least one of the first buffer layer and at least one second buffer layer which are alternately stacked on the substrate; and doping a carbon element in the second buffer layer, wherein an average carbon concentration of the second buffer layer is lower than or higher than an average carbon concentration of the first buffer layer.

As an optional embodiment, the second buffer layer comprises a plurality of sets of a third sub-buffer layer and a fourth sub-buffer layer stacked in layers; a carbon concentration of the third sub-buffer layer arranged at the first region is higher than a carbon concentration of the third sub-buffer layer arranged at the second region; and a carbon concentration of the fourth sub-buffer layer arranged at the first region is lower than a carbon concentration of the fourth sub-buffer layer arranged at the second region.

As an optional embodiment, the preparation method for a semiconductor structure, after the preparing a composite buffer layer on the substrate, further includes: preparing a barrier layer on a side of the composite buffer layer away from the substrate, wherein a carbon concentration of the barrier layer is lower than a carbon concentration of the composite buffer layer.

According to the semiconductor and its preparation method provided by the present disclosure, a stacked composite buffer layer structure is sequentially prepared on the substrate by different preparation methods. Therein, the substrate includes a first region arranged at the center and a second region arranged at the periphery of the first region, and the composite buffer layer includes a first buffer layer, the first buffer layer includes a carbon element, and the first buffer layer includes at least one set of a first sub-buffer layer and a second sub-buffer layer stacked in layers; and therein, a carbon concentration of the first sub-buffer layer arranged at the first region is higher than that of the second sub-buffer layer arranged at the first region; a carbon concentration of the second sub-buffer layer at the first region is lower than the carbon concentration of the second sub-buffer layer at the second region. Uniformity of the carbon concentration of the composite buffer layer may be effectively improved through the stacked composite buffer layer structure, and the carbon concentration at the center or edge of the substrate to be too high or too low may be effectively avoided, so as to improve the resistivity of the buffer layer, reduce electric leakage, effectively improve the breakdown voltage of the semiconductor structure, and enhance reliability.

DETAILED DESCRIPTION OF THE EMBODIMENTS

Exemplary embodiments will be described in detail herein and are illustrated with reference to accompanying drawings. When the following description refers to the drawings, the same reference numbers in different drawings refer to the same or similar elements unless otherwise indicated. The examples described in the following exemplary embodiments are not intended to represent all embodiments consistent with the present disclosure. On the contrary, they are merely examples which are consistent with some aspects of the disclosure as recited in the appended claims.

Figure 1:
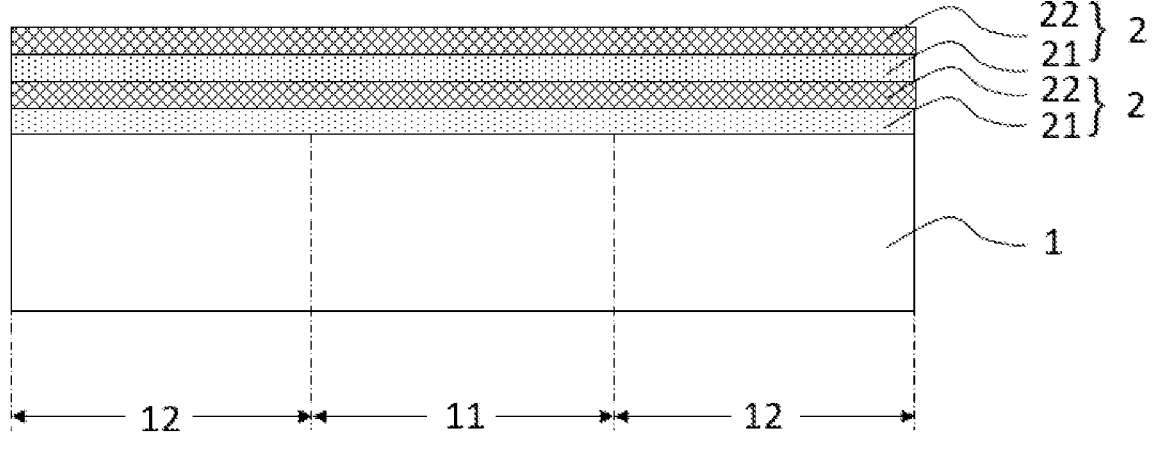
FIG. 1 is a schematic diagram of a semiconductor structure provided by an embodiment of the present disclosure.

An embodiment of the present disclosure provides a semiconductor structure. As shown in FIG. 1, the semiconductor structure includes: a substrate 1, where the substrate 1 includes a first region 11 arranged at the center of the substrate and a second region 12 arranged at the periphery of the first region 11; and a composite buffer layer arranged on the substrate 1. The composite buffer layer includes a first buffer layer 2 which includes a carbon element, and the first buffer layer 2 includes at least one set of a first sub-buffer layer 21 and a second sub-buffer layer 22 stacked in layers; where a carbon concentration of the first sub-buffer layer 21 at the first region 11 is higher than a carbon concentration of the first sub-buffer layer 21 arranged at the second region 12; a carbon concentration of the second sub-buffer layer 22 arranged at the first region 11 is lower than a carbon concentration of second sub-buffer layer 22 arranged at the second region 12. The semiconductor structure provided in this embodiment may effectively improve the uniformity of the carbon concentration of the composite buffer layer, effectively avoid the carbon concentration at the center or edge of the substrate to be too high or too low, improve the resistivity of the buffer layer, reduce electric leakage, and effectively increase a breakdown voltage of the semiconductor structure and enhance reliability.

In this embodiment, an average carbon concentration of the first sub-buffer layer 21 and an average carbon concentration of the second sub-buffer layer 22 may be the same or different. Preferably, the carbon concentration of the first sub-buffer layer 21 arranged at the first region 11 is higher than the carbon concentration of the second sub-buffer layer 22 arranged at the first region 11, and the carbon concentration of the first sub-buffer 21 arranged at the second region 11 layer is lower than the carbon concentration of the second sub-buffer layer arranged at the second region; such arrangement may ensure that the carbon concentrations of the first sub-buffer layer 21 and the second sub-buffer layer 22 at the first region 11 and at the second region 12 are neither too high nor too low. Preferably, the average carbon concentration of the first sub-buffer layer 21 and the average carbon concentration of the second sub-buffer layer 22 are controlled to be the same, that is, along a direction from the substrate 1 to the composite buffer layer, a structure with an alternate carbon concentration of high and low in layers is formed at both the first region 11 and the second region 12. When the carbon concentration of high and low is distributed alternately in layers, the energy band of the composite buffer layer is accordingly distributed with high and low in layers, which may affect electron transport by fluctuation of the energy band, thereby further improving the breakdown voltage. In other embodiments, the average carbon concentration of the first sub-buffer layer 21 and the average carbon concentration of the second sub-buffer layer 22 may be different, which needs that the highest carbon concentration of the first sub-buffer layer 21 and the second sub-buffer layer 22 is lower than 2E20, and the minimum carbon concentration of the first sub-buffer layer 21 and the second sub-buffer layer 22 is higher than 1E17. Optionally, the carbon concentration of the composite buffer layer is higher than 1E17 and lower than 2E20, and preferably, the average carbon concentration of the composite buffer layer is higher than 1E18 and lower than 2E20, so that an effective resistivity may be ensured.

As a preferred technical solution, the first buffer layer 2 of the present embodiment is formed into a superlattice structure, and a combination of the first sub-buffer layer 21 and the second sub-buffer layer 22 forms a minimum repeating unit, where the thickness of the first sub-buffer layer 21 and the thickness of the second sub-buffer layer 22 are lower than 5 um. The superlattice structure of the first buffer layer 2 may effectively release the stress between the substrate 1 and subsequent epitaxial layers, so as to improve the crystal quality of the subsequent epitaxial structure and improve the device performance.

In an optional embodiment, the thicknesses of the first sub-buffer layer 21 and the thicknesses of the second sub-buffer layer 22 are higher than 5 nm and lower than 1 um.

In this embodiment, the positions of the first sub-buffer layer 21 and the second sub-buffer layer 22 are not limited, as long as the first buffer layer 2 is an alternately stacked structure of the first sub-buffer layer 21 and the second sub-buffer layer 22. For example, a minimum repeating stacking unit of the first buffer layer 2 is a combination of the first sub-buffer layer 21 and the second sub-buffer layer 22, where the first sub-buffer layer 21 is close to a side of the substrate 1, or the second sub-buffer layer 22 is close to a side of the substrate 1.

In this embodiment, the material of the substrate 1 may be silicon (Si), silicon carbide (SiC), aluminum oxide ($Al_2O_3$), GaN or other materials, which are not limited in this embodiment.

The material of the composite buffer layer is a GaN-based material, and the materials of the first sub-buffer layer 21 and the second sub-buffer layer 22 may be one or more of aluminum nitride (AlN), aluminum gallium nitride (AlGaN), gallium nitride (GaN), aluminum indium nitride (AlInN), and aluminum indium gallium nitride (AlInGaN).

In this embodiment, the shape of the first region 11 is a circle, the first region 11 is arranged at a central area of the substrate 1, the radius of the first region 11 is smaller than half of the radius of the substrate 1, and the second region 12 is arranged at the peripheral area of the first region 11 on the substrate 1. In other embodiments, the shape of the first region 11 may also be an ellipse or a polygonal shape such as a square or a hexagon. Understandably, this embodiment only lists some possible implementations of the first region 11, but not for limiting the shape of the first region 11; and the area of first region 11 is smaller than half of the area of substrate 1.

Figure 2:
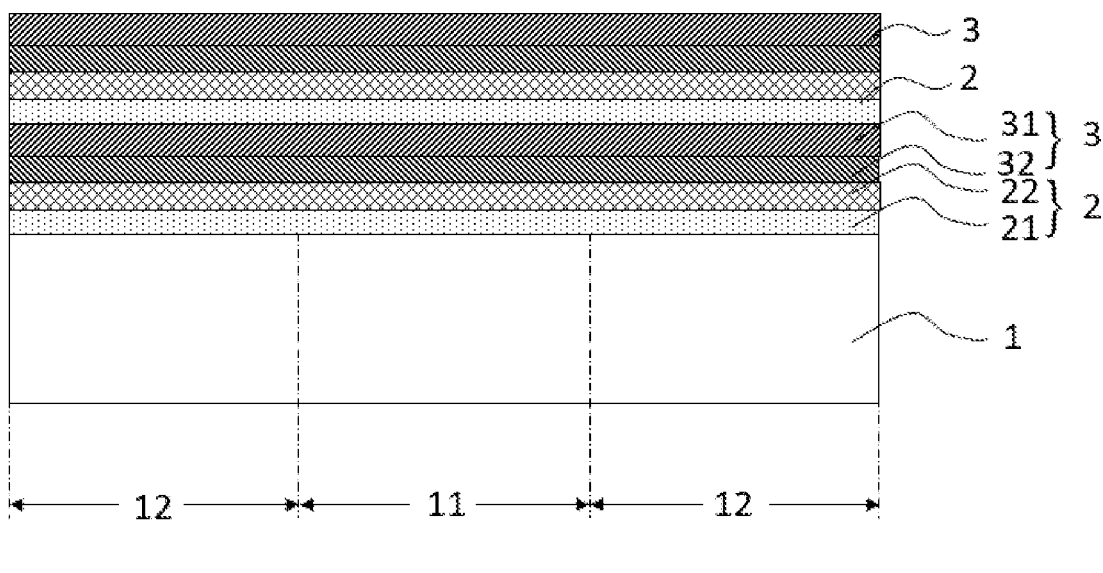
FIG. 2 is a schematic diagram of a semiconductor structure provided by another embodiment of the present disclosure.

The structure of the embodiment according to the present disclosure shown in FIG. 2 is substantially the same as that of the embodiment according to the present disclosure shown in FIG. 1, and the difference is that, as shown in FIG. 2, the composite buffer layer includes at least one of the first buffer layer 2, and the composite buffer layer further includes at least one second buffer layer 3, and at least one of the second buffer layer 3 and at least one of the first buffer layer 2 are stacked alternately on the substrate 1. The second buffer layer 3 includes a carbon element, and an average carbon concentration of the second buffer layer 3 is different from the average carbon concentration of the first buffer layer 2.

The average carbon concentration of the second buffer layer 3 is different from the average carbon concentration of the first buffer layer 2, so as to further form a structure with an alternate carbon concentration of high and low in layer. The energy band of the composite buffer layer is accordingly distributed with high and low in layers, which may affect electron transport by fluctuation of the energy band, thereby further improving the breakdown voltage.

Furthermore, the second buffer layer 3 includes at least one set of a third sub-buffer layer 31 and a fourth sub-buffer layer 32 stacked in layers, where a carbon concentration of the third sub-buffer layer 31 arranged at the first region 11 is higher than that of the third sub-buffer layer 31 arranged at the second region 12; and a carbon concentration of the fourth sub-buffer layer 32 arranged at the first region 11 is lower than a carbon concentration of the fourth sub-buffer layer 32 arranged at the second region 12.

This embodiment does not limit the positions of the second buffer layer 3 and the first buffer layer 2. When the number of the second buffer layer 3 and the number of the first buffer layer 2 are both one, the second buffer layer 3 may be formed on the first buffer layer 2 or the second buffer layer 3 may be formed between the first buffer layer 2 and the substrate 1; when the number of the second buffer layer 3 and the number of the first buffer layer 2 are more than one, the second buffer layer 3 and the first buffer layer 2 may be stacked alternately in layers.

In this embodiment, the material of the second buffer layer 3 is a GaN-based material, and the materials of the third sub-buffer layer 31 and the fourth sub-buffer layer 32 may be one or more of AlN, AlGaN, GaN, AlInN or AlInGaN.

Figure 3:
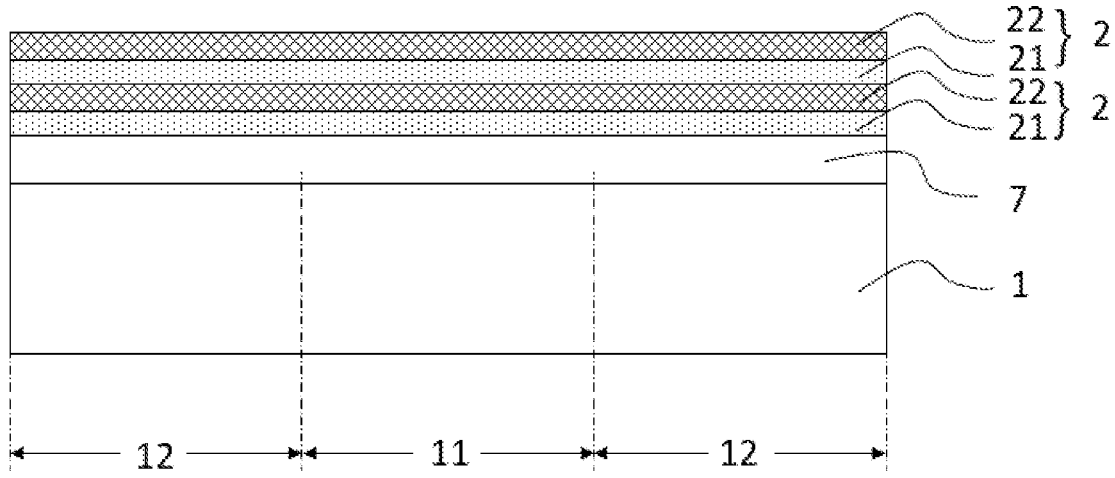
FIG. 3 is a schematic diagram of a semiconductor structure provided by still another embodiment of the present disclosure.

The content of another embodiment according to the present disclosure is substantially the same as that of the embodiment according to the present disclosure shown in FIG. 1 and FIG. 2, and the difference is that the carbon concentration of the composite buffer layer gradually increases or firstly increases and then decreases along a direction from the substrate 1 to the composite buffer layer. In this way, the carbon concentration of the composite buffer layer arranged close to the substrate 1 may be relatively low, which may ensure an excellent crystallinity of the semiconductor structure. At the same time, along the direction from substrate 1 to the composite buffer layer, the carbon concentration of the composite buffer layer gradually increases, which may significantly reduce a concentration of current carriers in this region, accordingly, inhibit the occurrence of off-leakage current, thereby increasing the breakthrough voltage. Preferably, as shown in FIG. 3, the semiconductor structure may further include a transition layer 7, arranged between the substrate 1 and the composite buffer layer, and the material of the transition layer 7 is a GaN-based material. And the transition layer 7 is not doped with carbon element, to further ensure the crystallinity of the semiconductor structure.

Figure 4:
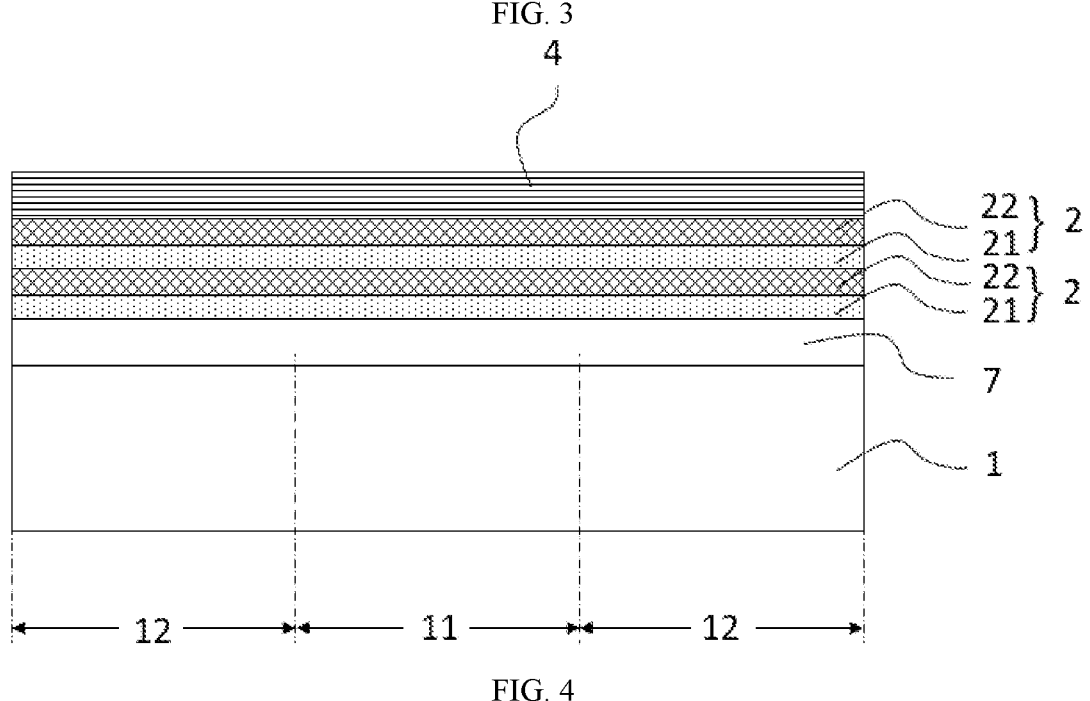
FIG. 4 is a schematic diagram of a semiconductor structure provided by yet still another embodiment of the present disclosure.

Furthermore, in part of the composite buffer layer away from the substrate 1, the carbon concentration was gradually reduced to avoid incorporation of carbon into an epitaxial structure arranged on the composite buffer layer, and to improve the dynamic characteristics of the semiconductor structure. More preferably, as shown in FIG. 4, the semiconductor structure further includes a blocking layer 4, arranged on a side of the composite buffer layer away from the substrate 1, and a carbon concentration of the blocking layer 4 is lower than that of the composite buffer layer. Furthermore, the blocking layer 4 may be a GaN-based material layer that is not doped with carbon element, to ensure that no impurities are doped in a channel layer, thereby ensuring linearity of transconductance and avoiding deterioration of the dynamic characteristics of the device.

The material of the transition layer 7 and the material of the barrier layer 4 are the same or different, which may be group-III nitride materials, and preferably, the material of the transition layer 7 and the material of the barrier layer 4 are AlGaN.

Figure 5:
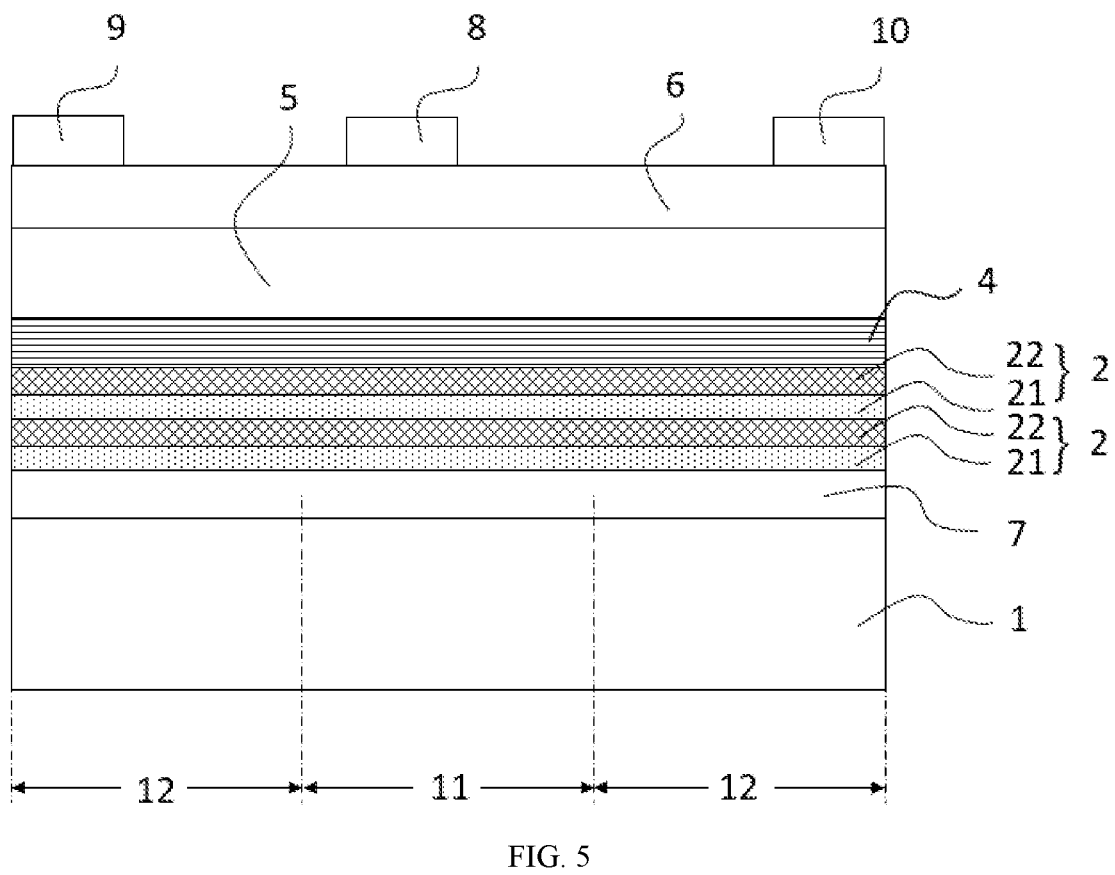
FIG. 5 is a schematic diagram of a semiconductor structure provided by yet still another embodiment of the present disclosure.

The content of the embodiment according to the present disclosure shown in FIG. 5 is substantially the same as that of the embodiment according to the present disclosure shown in FIG. 1 to FIG. 4, and the difference is that, as shown in FIG. 5, the semiconductor structure further includes a channel layer 5 and a barrier layer 6, the channel layer 5 and the barrier layer 6 are sequentially formed on a side of the composite buffer layer away from the substrate 1. The material of the channel layer 5 and the material of the barrier layer 6 are group-III nitride materials. In this embodiment, the material of the channel layer 5 is GaN, and the material of the barrier layer 6 is AlGaN; in other embodiments, the material of the channel layers 5 and the material of the barrier layer 6 may be AlN, AlInN or other materials, which is not limited in this embodiment.

Furthermore, the semiconductor structure further includes a gate electrode 8, a source electrode 9 and a drain electrode 10, where the gate electrode 8 is arranged on the surface of the barrier layer 6 away from the substrate 1, and the source electrode 9 and the drain electrode 10 are respectively arranged at two ends of the gate electrode 8.

In this semiconductor structure, the composite buffer layer described in the above embodiments restricts currents in an upper space of the composite buffer layer, which improves the resistivity of the composite buffer layer, reduces electric leakage, and increases the breakdown voltage.

Figure 6:
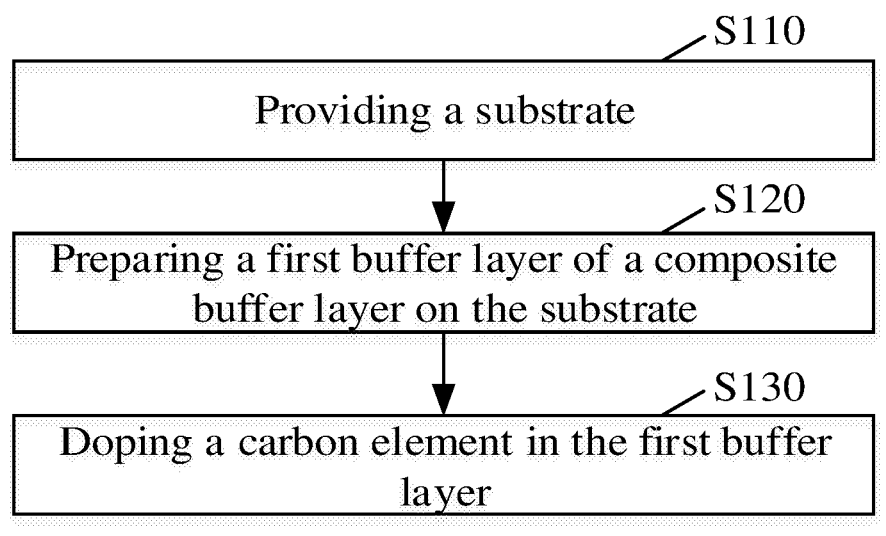
FIG. 6 is a flowchart of a preparation method for a semiconductor structure according to an embodiment of the present disclosure.

Another embodiment of the present disclosure provides a preparation method for a semiconductor structure. As shown in FIG. 6, with reference to FIG. 1 to FIG. 5, the preparation method includes the following steps.

Step S110: providing a substrate.

Step S120: preparing a first buffer layer of a composite buffer layer on the substrate.

Exemplarily, preparing a first buffer layer 2 includes preparing a plurality of sets of a first sub-buffer layer 21 and a second sub-buffer layer 22 stacked in layers.

Step S130: doping a carbon element in the first buffer layer.

Exemplarily, a carbon concentration of the first sub-buffer layer 21 arranged at the first region 11 is higher than a carbon concentration of the first sub-buffer layer 21 arranged at the second region 12; and a carbon concentration of the second sub-buffer layer 22 arranged at the first region 11 is smaller than a carbon concentration of the second sub-buffer layer 22 arranged at the second region 12.

The preparation method for a semiconductor structure provided in this embodiment may effectively improve uniformity of the carbon concentration of the composite buffer layer, effectively avoid the carbon concentration at the center or edge of the substrate to be too high or too low, improve the resistivity of the buffer layer, reduce electric leakage, and effectively increase a breakdown voltage of the semiconductor structure and enhance reliability.

Furthermore, the preparing a first sub-buffer layer 21 includes preparing the first sub-buffer layer 21 in a first condition. The first condition includes that a carbon element doping source is an organic compound, and the carbon element doping source selected in this embodiment includes any one of methane ($CH_4$), ethylene ($C_2H_4$), ethane ($C_2H_6$), propane ($C_3H_8$) and other materials. The preparing a second sub-buffer layer 22 includes preparing the second sub-buffer layer 22 in a second condition. The second condition includes that the carbon element doping source is an MO source, and the MO source may be (TM Ga), and the second condition further includes that a temperature is lower than 1000° C., or a growth rates is greater than 2 um/h.

In this embodiment, the preparing a composite buffer layer on the substrate 1 may further includes: preparing at least one of the first buffer layer 2 and at least one of the second buffer layer 3 on the substrate 1 alternately. Therein, the preparing the second buffer layer 3 also includes doping the carbon element in the second buffer layer 3. And the average carbon concentration of the second buffer layer 3 is lower than or higher than the average carbon concentration of the first buffer layer 2.

Therein, the second buffer layer 3 includes a plurality of sets of a third sub-buffer layer 31 and a fourth sub-buffer layer 32 stacked in layers, and a carbon concentration of the third sub-buffer layer 31 arranged at the first region 11 is higher than that of the third sub-buffer layer 31 arranged at the second region 12; and a carbon concentration of the fourth sub-buffer layer 32 arranged at the first region 11 is lower than a carbon concentration of the fourth sub-buffer layer 32 arranged at the second region 12.

After the preparing a composite buffer layer on the substrate 1, the method further includes: preparing a blocking layer 4 on a side of the composite buffer layer away from the substrate 1, where a carbon concentration of the barrier layer is lower than the carbon concentration of the composite buffer layer.

Before the preparing a composite buffer layer on the substrate 1, the method further includes: firstly, preparing a transition layer 7 on the substrate 1, and then preparing the composite buffer layer on the transition layer 7; and after the preparing a composite buffer layer on the substrate 1, the method further includes: preparing a channel layer 5 and a barrier layer 6 on the side of the composite buffer layer away from substrate 1 sequentially.

In this embodiment, after the preparing a composite buffer layer on the substrate 1, and before the preparing a channel layer 5 and a barrier layer 6 on the side of the composite buffer layer away from substrate 1 sequentially, the method further includes: preparing a blocking layer 4 on the composite buffer layer, therein the carbon concentration of the barrier layer 4 is smaller than that of the composite buffer layer.

Furthermore, after the preparing the channel layer 5 and the barrier layer 6, the method further includes: preparing a gate electrode 8, a source electrode 9 and a drain electrode 10 on a side of the barrier layer 6 away from the substrate 1 respectively, therein, the source electrode 9 and the drain electrode 10 are arranged at two ends of the gate electrode 8 respectively.

The content of another embodiment according to the present disclosure is substantially the same as that of the embodiment according to the present disclosure shown in FIG. 1 to FIG. 5, the difference is that the composite buffer layer further includes an aluminum element, and along the direction from the substrate 1 to the composite buffer layer, the aluminum concentration of the composite buffer layer may be constant, or decrease gradually, or firstly increase and then decrease. The arrangement of the aluminum element increases the band gap of the composite buffer layer, thereby increasing the resistivity, reducing electric leakage and increasing the breakdown voltage. In an optional embodiment, the composite buffer layer includes several sub-layers, and the aluminum composition content of the composite buffer layer can be complementary to the carbon composition content of the composite buffer layer, that is, the sub-layer with a low carbon composition content has a high aluminum composition content, and the sub-layer with a high carbon composition content has a low aluminum composition content to balance the average resistivity between the sub-layers of the composite buffer layer and further improve the breakdown voltage.

The embodiments described above are only preferred embodiments of the present disclosure, and are not intended to limit the present disclosure in any form. Although the present disclosure has been disclosed above in preferred embodiments, it is not intended to limit the present disclosure. Those skilled in the art, without departing from the scope of the technical solution of the present disclosure, can make some changes or modifications to provide equivalent embodiments by using the technical content disclosed above. Any content that does not depart from the technical solution of the present disclosure, any simple modifications, equivalent changes and modifications made to the above embodiments according to the technical essence of the disclosure still fall within the scope of the technical solutions of the present disclosure.

What is claimed is:

1. A semiconductor structure, comprising:
    a substrate, comprising a first region at a center of the substrate and a second region at a periphery of the first region; and
    a composite buffer layer arranged at the substrate, wherein the composite buffer layer comprises a first buffer layer, the first buffer layer comprises a carbon element, and the first buffer layer comprises at least one set of a first sub-buffer layer and a second sub-buffer layer stacked in layers;
    wherein in a transverse direction parallel to a surface of the substrate, a carbon concentration of the first sub-buffer layer arranged at the first region is higher than a carbon concentration of the first sub-buffer layer arranged at the second region, and
    in the transverse direction parallel to the surface of the substrate, a carbon concentration of the second sub-buffer layer arranged at the first region is lower than a carbon concentration of the second sub-buffer layer arranged at the second region.

2. The semiconductor structure according to claim 1, wherein the carbon concentration of the first sub-buffer layer arranged at the first region is higher than the carbon concentration of the second sub-buffer layer arranged at the first region.

3. The semiconductor structure according to claim 1, wherein the carbon concentration of the first sub-buffer layer arranged at the second region is lower than the carbon concentration of the second sub-buffer layer arranged at the second region.

4. The semiconductor structure according to claim 1, wherein a minimum repeating unit of the first buffer layer is the first sub-buffer layer and the second sub-buffer layer, and in the minimum repeating unit, the first sub-buffer layer is closer to the substrate, or the second sub-buffer layer is closer to the substrate.

5. The semiconductor structure according to claim 1, wherein a thickness of the first sub-buffer layer and a thickness of the second sub-buffer layer are both lower than 5 um.

6. The semiconductor structure according to claim 1, wherein
    the composite buffer layer comprises at least one of the first buffer layer,
    the composite buffer layer further comprises at least one second buffer layer, and the at least one second buffer layer and the at least one of the first buffer layer are alternately stacked on a side of the substrate, and
    the second buffer layer comprises a carbon element, and an average carbon concentration of the second buffer layer is lower than or higher than an average carbon concentration of the first buffer layer.

7. The semiconductor structure according to claim 6, wherein
    the second buffer layer comprises at least one set of a third sub-buffer layer and a fourth sub-buffer layer stacked in layers,
    a carbon concentration of the third sub-buffer layer arranged at the first region is higher than a carbon concentration of the third sub-buffer layer arranged at the second region, and
    a carbon concentration of the fourth sub-buffer layer arranged at the first region is lower than a carbon concentration of the fourth sub-buffer layer arranged at the second region.

8. The semiconductor structure according to claim 1, wherein a carbon concentration of the composite buffer layer is higher than $1E17$ cm$^{-3}$ and lower than $2E20$ cm$^{-3}$.

9. The semiconductor structure according to claim 1, wherein a carbon concentration of the composite buffer layer gradually increases or firstly increases and then decreases along a direction from the substrate to the composite buffer layer.

10. The semiconductor structure according to claim 1, wherein the composite buffer layer further comprises an aluminum element, and a composition content of aluminum is constant or gradually decreases or firstly increases and then decreases, or is complementary to a composition content of carbon along a direction from the substrate to the composite buffer layer.

11. The semiconductor structure according to claim 1, wherein a shape of the first region is any one of a circle, an ellipse or a polygon.

12. The semiconductor structure according to claim 1, wherein an area of the first region is lower than half of an area of the substrate.

13. The semiconductor structure according to claim 1, further comprising a transition layer arranged between the substrate and the composite buffer layer.

14. The semiconductor structure according to claim 1, further comprising a barrier layer arranged at a side of the composite buffer layer away from the substrate, wherein a carbon concentration of the barrier layer is lower than a carbon concentration of the composite buffer layer.

15. A preparation method for a semiconductor structure, comprising:

providing a substrate, wherein the substrate comprises a first region arranged at a center of the substrate and a second region arranged at a periphery of the first region; and preparing a composite buffer layer on the substrate, comprising:

preparing a first buffer layer, comprising: preparing at least one set of a first sub-buffer layer and a second sub-buffer layer stacked in layers; and doping a carbon element in the first buffer layer, wherein in a transverse direction parallel to a surface of the substrate, a carbon concentration of the first sub-buffer layer arranged at the first region is higher than a carbon concentration of the first sub-buffer layer arranged at the second region, and in a transverse direction parallel to a surface of the substrate, a carbon concentration of the second sub-buffer layer at the first region is lower than a carbon concentration of the second sub-buffer layer arranged at the second region.

16. The preparation method for a semiconductor structure according to claim 15, wherein the preparing at least one set of a first sub-buffer layer and a second sub-buffer layer stacked in layers comprises:

preparing the first sub-buffer layer in a first condition, wherein the first condition comprises that a carbon element doping source is an organic compound.

17. The preparation method for a semiconductor structure according to claim 15, wherein the preparing at least one set of a first sub-buffer layer and a second sub-buffer layer stacked in layers comprises:

preparing the second sub-buffer layer in a second condition, wherein the second condition comprises that a carbon element doping source is a metal-organic compound (MO) source, and the second condition further comprises:

a temperature is lower than 1000° C., or a growth rate is greater than 2 um/h.

18. The preparation method for a semiconductor structure according to claim 15, wherein the preparing a composite buffer layer on the substrate further comprises:

preparing at least one of the first buffer layer and at least one second buffer layer which are alternately stacked on the substrate; and doping a carbon element in the second buffer layer, wherein an average carbon concentration of the second buffer layer is lower than or higher than an average carbon concentration of the first buffer layer.

19. The preparation method for a semiconductor structure according to claim 18, wherein the second buffer layer comprises a plurality of sets of a third sub-buffer layer and a fourth sub-buffer layer stacked in layers;

a carbon concentration of the third sub-buffer layer arranged at the first region is higher than a carbon concentration of the third sub-buffer layer arranged at the second region; and a carbon concentration of the fourth sub-buffer layer arranged at the first region is lower than a carbon concentration of the fourth sub-buffer layer arranged at the second region.

20. The preparation method for a semiconductor structure according to claim 15, after the preparing a composite buffer layer on the substrate, further comprising:

preparing a barrier layer on a side of the composite buffer layer away from the substrate, wherein a carbon concentration of the barrier layer is lower than a carbon concentration of the composite buffer layer.

* * * * *